(12) United States Patent
Zeytoonian

(10) Patent No.: US 8,057,146 B2
(45) Date of Patent: Nov. 15, 2011

(54) FASTENING APPARATUS

(75) Inventor: Paul N. Zeytoonian, Sudbury, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 501 days.

(21) Appl. No.: 12/184,521

(22) Filed: Aug. 1, 2008

(65) Prior Publication Data

US 2010/0024726 A1 Feb. 4, 2010

(51) Int. Cl.
*F16B 13/04* (2006.01)
(52) U.S. Cl. .................... 411/372.5; 411/373; 411/999
(58) Field of Classification Search .................. 411/354, 411/82, 43, 554, 38, 42, 372.5–373, 429, 411/999
See application file for complete search history.

(56) References Cited

U.S. PATENT DOCUMENTS

| 4,407,477 A * | 10/1983 | Backlund et al. ............. 248/499 |
| 2008/0243185 A1* | 10/2008 | Felix et al. .................... 606/246 |
| 2009/0143827 A1* | 6/2009 | Levy et al. .................... 606/308 |

* cited by examiner

*Primary Examiner* — Robert Kim
*Assistant Examiner* — Johnnie Smith

(57) ABSTRACT

One embodiment of this fastening apparatus comprises a cap with a passage through the length of the cap. This cap is received by the upper panels of a body. The embodiments of this fastening apparatus may have two or more upper panels that form a recess. The body also has a lower region with a passage. The upper panels are flexible and can translate to retain the cap within the recess. A threaded member is disposed in the passage of the body. This cap may be fabricated of graphite in one instance.

10 Claims, 5 Drawing Sheets

FASTENING APPARATUS

FIELD

This invention relates to a fastening apparatus, and, more particularly, to a fastening apparatus that prevents over-tightening and that reduces contamination from stainless steel or other metals.

BACKGROUND

Parts, such as graphite shields and electrodes, need to be fastened to other components within an ion implanter or other plasma processing tool. Previous methods of fastening have used stainless steel vented shoulder screws or bearing shims. However, stainless steel or other metal fastening devices have two drawbacks. First, when over-tightened, these devices may crack the part being fastened to another component. Second, stainless steel or other metals contaminate the beam or workpiece being processed or implanted. Merely covering a stainless steel or other metal fastener with a supplementary graphite shield increases material costs and complexity without addressing the problem of over-tightening parts. Graphite itself is also prone to cracking. If a supplementary shield or graphite fastening device cracks, it may prevent or impede repair or replacement.

Accordingly, there is a need in the art for an improved fastening apparatus and, more particularly, a fastening apparatus that prevents over-tightening and that reduces contamination from stainless steel or other metals.

SUMMARY

According to a first aspect of the invention, a fastening apparatus is provided. The fastening apparatus comprises a cap defining a passage through the length of the cap; a body having a lower region and at least two upper panels, the lower region defining a passage through the length of the lower region, the upper panels configured to receive the cap, the upper panels configured to translate thereby retaining the cap between the upper panels; and a threaded member disposed in the passage of the lower region.

According to a second aspect of the invention, a fastening apparatus is provided. The fastening apparatus comprises a cap having at least one protrusion, the cap defining a passage through the length of the cap; a body having a lower region and at least two upper panels, the lower region defining a passage through the length of the lower region, the upper panels configured to receive the cap and the upper panels defining a recess configured to receive the protrusion of the cap, the upper panels configured to translate thereby retaining the cap between the upper panels; and a threaded member disposed in the passage of the lower region.

According to a third aspect of the invention, an ion implanter is provided. The ion implanter comprises an ion source that generates ions; a workpiece that the ions are directed toward; a fastening apparatus comprising a cap defining a passage through the length of the cap; a body having a lower region and at least two upper panels, the lower region defining a passage through the length of the lower region, the upper panels configured to receive the cap, the upper panels configured to translate thereby retaining the cap between the upper panels; and a threaded member disposed in the passage of the lower region; a first component; and a second component secured to the first component with the fastening apparatus.

BRIEF DESCRIPTION OF THE DRAWINGS

For a better understanding of the present disclosure, reference is made to the accompanying drawings, which are incorporated herein by reference and in which.

DETAILED DESCRIPTION

Figure 1:
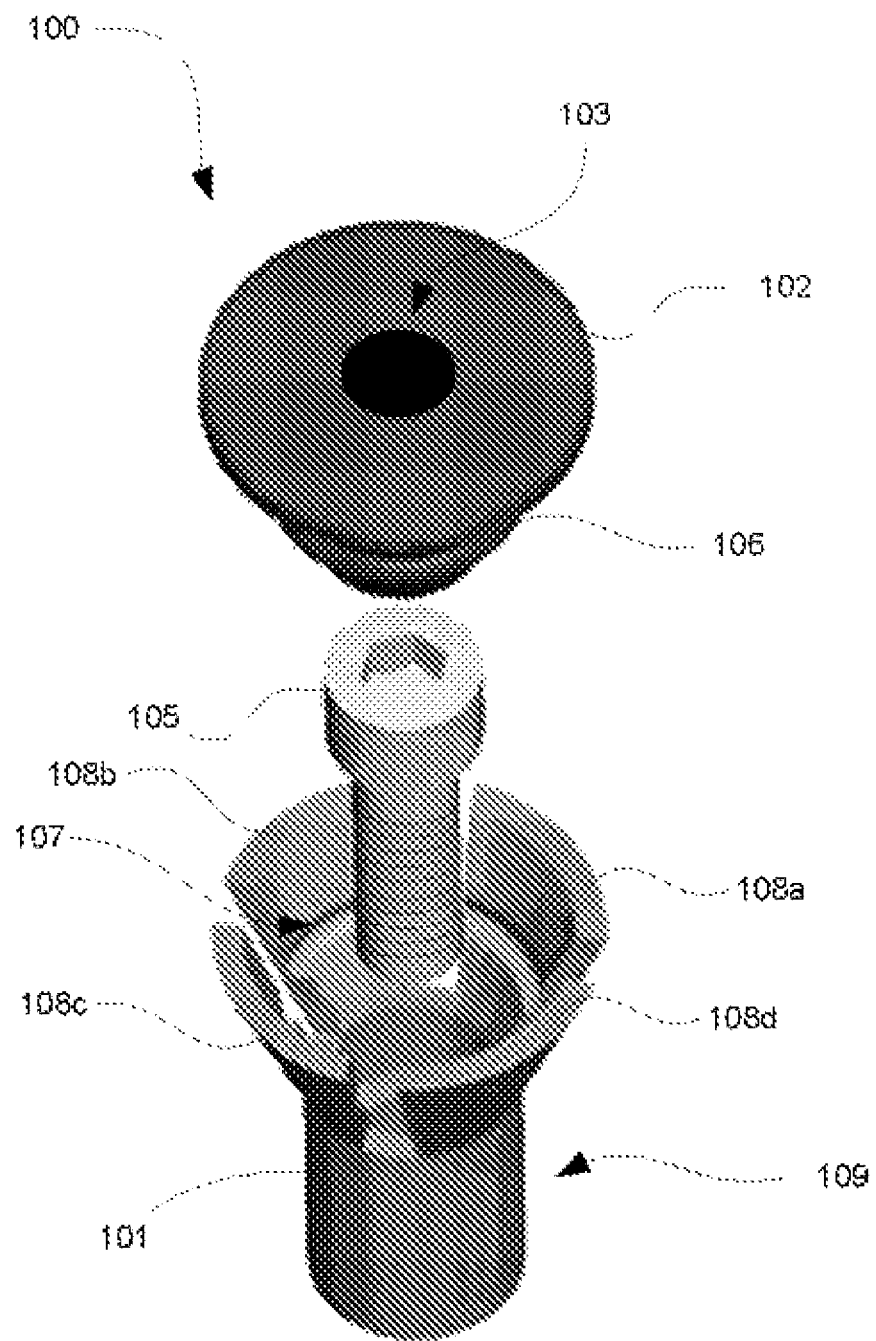
FIG. 1 is an exploded perspective view of a first embodiment of a fastening apparatus.

FIG. 1 is an exploded perspective view of a first embodiment of a fastening apparatus 100. The threaded member 105, cap 102, and body 101 may be separate from one another. The threaded member 105 is received by the body 101. The cap 102 is also received by the body 101 and is disposed against the upper panels 108a-d of the body 101. This body 101 may be a collet or spider in this particular instance. The protrusion 106 of the cap 102 is configured to be received by the recess 107 of the upper panels 108a-d. In the embodiment of FIG. 1, there are four upper panels 108a-d. However, other numbers of upper panels 108 are possible and this fastening apparatus 100 is not limited solely to four upper panels 108. In one instance, the fastening apparatus 100 may have only two upper panels 108.

In this particular embodiment, when the threaded member 105 and cap 102 are disposed in the body 101, the fastening apparatus 100 may be used to fasten a component to another part or component. While the threaded member 105 may be metal, the cap 102 covers much of the threaded member 105, leaving only the portion of the threaded member 105 within the passage 103 exposed. The cap 102, in one particular embodiment, is fabricated of or coated with graphite. This reduces contamination due to exposed metal within an ion implanter because the only exposed metal is through the passage 103.

The upper panels 108a-d of the body 101 may be configured to have an opening slightly wider than the dimension of the cap 102. Thus, the cap 102 may be received by the upper panels 108a-d. The upper panels 108a-d may translate toward to cap 102 to retain the cap 102 in the body 101.

Figure 2:
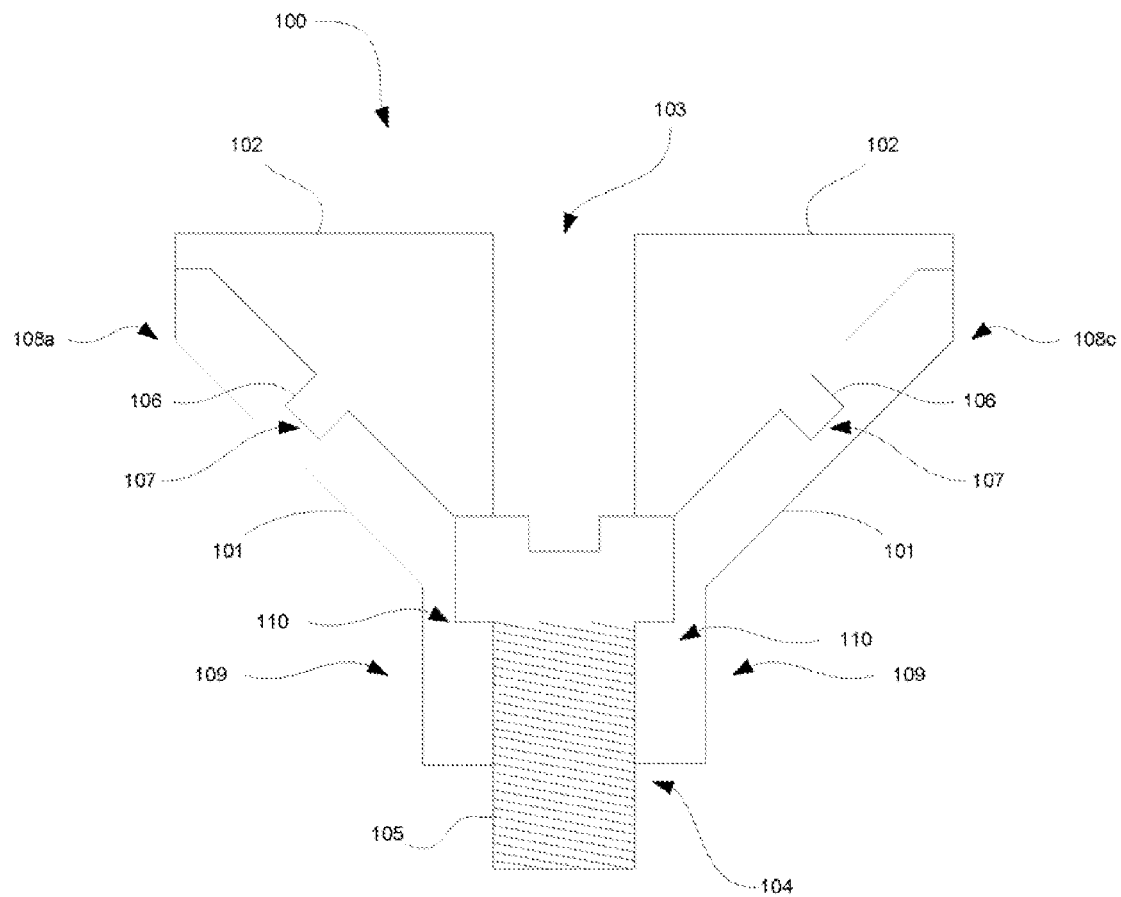
FIG. 2 is a cross-sectional view of the first embodiment of a fastening apparatus of FIG. 1.

FIG. 2 is a cross-sectional view of the first embodiment of a fastening apparatus 100 of FIG. 1. The fastening apparatus 100 has a body 101 having a lower region 109 and at least two upper panels 108a, 108c. In this embodiment, the body 101 is fabricated of stainless steel or aluminum. The body 101 may be or include a stainless steel or aluminum spider or collet in one particular embodiment. A spider is a part having a number of radiating arms visually not connected at their outer ends. A collet is a slotted sleeve that holds a part or component, such as the cap 102, for example.

The lower region 109 of the body 101 defines a passage 104 through the length of the lower region 109. The passage 104 is configured to receive a threaded member 105. The lower region 109 also may include a lip 110 that will contact a threaded member 105 and translate the fastening apparatus 100 in the direction the threaded member 105 is translated.

The upper panels 108a, 108c are configured to be flexible and to translate with respect to the lower region 109 as the threaded member 105 is translated. Each upper panel 108 defines at least one recess 107. In another embodiment, each upper panel 108 has more than one recess 107.

The fastening apparatus 100 also has a cap 102. In this particular embodiment, the cap 102 may be fabricated of or coated with graphite, a material containing graphite, or another compound that does not contaminate an ion implanter. The outer surface of the cap 102 is round in this particular embodiment, but the cap 102 may also be hexagonal, square, or other shapes. The cap 102 defines a passage 103 through the length of the cap 102. The cap 102 also has at least one protrusion 106. The protrusion 106 is configured to be received by the recess 107. When the protrusion 106 is received by the recess 107, the cap 102 is retained by the upper panels 108a, 108c of the body 101. In other embodiments, the cap 102 may define a recess and the upper panels 108 may have protrusions, the upper panels 108 may have an upper lip that retains the cap 102, or the cap 102 may be retained within the upper panels 108 using pressure.

The fastening apparatus 100 includes a threaded member 105. This threaded member 105 is disposed within the passage 104 and may rest or be disposed against the cap 102. In other embodiments, there may be a gap between the threaded member 105 and the cap 102. The fastening apparatus 105 is configured to receive a tool, such as a screwdriver, Allen wrench, hex key, or other tool known to those skilled in the art. In one particular embodiment, the fastening apparatus 105 is a stainless steel socket head cap screw, although other threaded devices, such as screws or bolts, also may be used. The threaded member 105 is held in the fastening apparatus 100 when the cap 102 is retained by the upper panels 108 of the body 101 in this particular embodiment.

Figure 3:
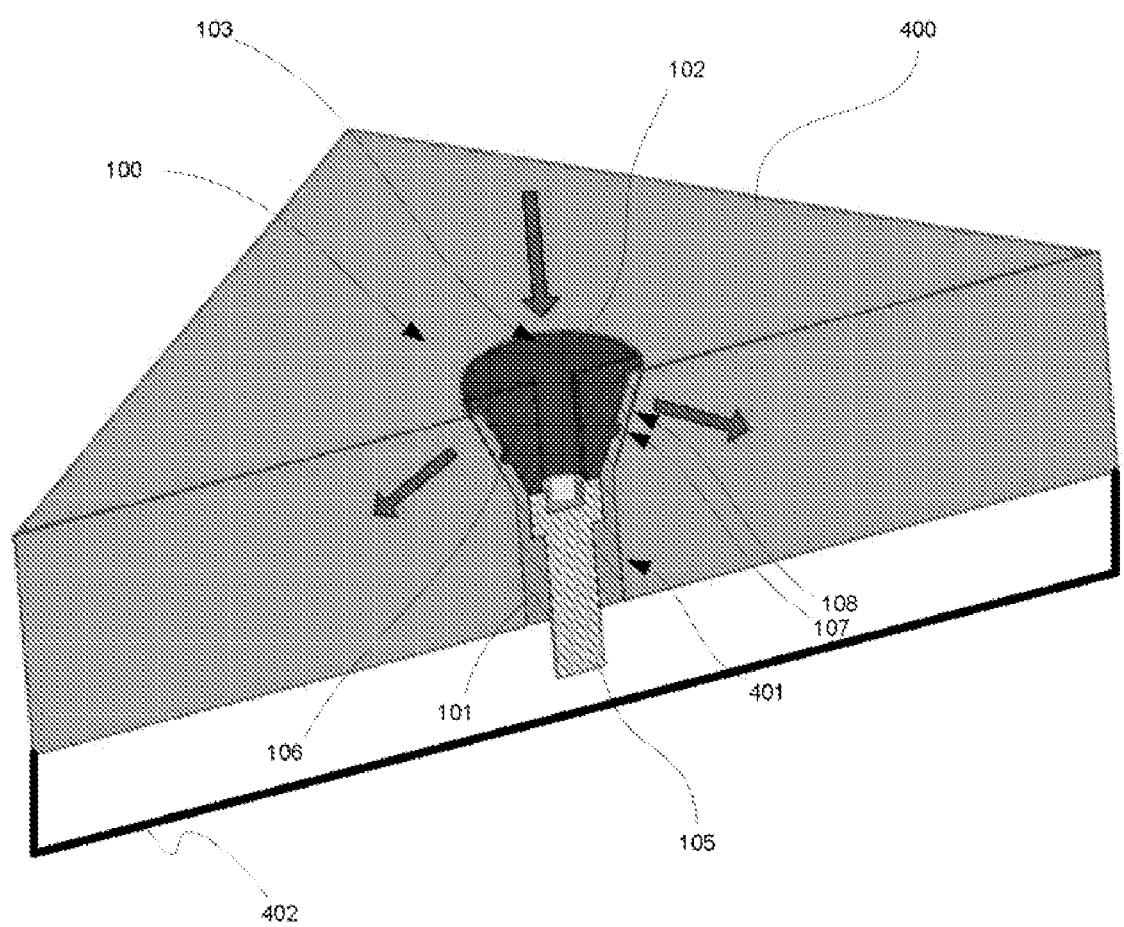
FIG. 3 is a cross-sectional view of the first embodiment of a fastening apparatus inserted into a component or part.

FIG. 3 is a cross-sectional view of the first embodiment of a fastening apparatus 100 inserted into a component or part. The fastening apparatus 100 is inserted into a component 400, such as a graphite shield or an electrode in an ion implanter, to secure it to another component or part below the component 400, such as component 402, which may be stainless steel or aluminum. For example, the resolving aperture in an ion implanter includes a graphite aperture, a deceleration lens includes a graphite lens, and the ion source includes shielding, all of which may benefit from the fastening apparatus 100. The component 402 may have a threaded hole, in one embodiment.

The component 400 defines an opening 401 configured to receive the fastening apparatus 100. At least part of the cap 102 of the fastening apparatus 100 may protrude from the component 400. However, in another embodiment, the fastening apparatus 100 may be flush with the component 400 after insertion.

To fasten the component 400 to the component 402, the fastening apparatus 100 is inserted into the opening 401. A tool, such as a screwdriver, Allen wrench, hex key, or other tool known to those skilled in the art is inserted into the passage 103 so that it is disposed on the threaded member 105. When the threaded member 105 is tightened using the tool, the threaded member 105 fastens the component 400 to the component 402.

The upper panels 108 may be angled outward from the body 101 approximately more than the angle of the walls defining the opening 401. Thus, the dimension of the upper panels 108 at the top of body 101 is approximately larger than the dimension at the top of the opening 401. The shape of the opening 401 may allow the upper panels 108 to retain the cap 102. The shape of the opening 401 may be configured to vary the amount of pressure exerted on the cap 102 because the upper panels 108 will translate toward the cap 102 a distance corresponding with the shape of the opening 401.

As the threaded member 105 is tightened, the threaded member 105 is drawn downward into the component 400. As the fastening apparatus 100 is drawn downward, the upper members 108 constrict and are translated toward the cap 102 by contact with the component 400. The protrusion 106 is disposed in the recess 107 and, as the upper members 108 constrict, the cap 102 becomes retained by the upper members 108.

The cap 102 may hold the threaded member 105 in the fastening apparatus 100 in this embodiment. The cap 102 also prevents over-tightening of the threaded member 105 into the component 400. As the threaded member 105 is screwed into the component 400, the upper members 108 constrict around the cap 102. Eventually, however, the upper members 108 will be unable to constrict any further due to the presence of the cap 102. Thus, the fastening apparatus 100 cannot be over-inserted or over-tightened into the component 400, preventing damage to the component 400. Furthermore, because the cap 102 is not screwed like the threaded member 105, damage to the cap 102 is reduced. As the threaded member 105 is tightened, it is forced against the body 101 rather than the cap 102. The body 101 also may prevent damage to the component 400. As the threaded member 105 is tightened, the bottom of the body 101 may in one instance become disposed against the component 402. This may prevent further tightening of the threaded member 105.

Figure 4:
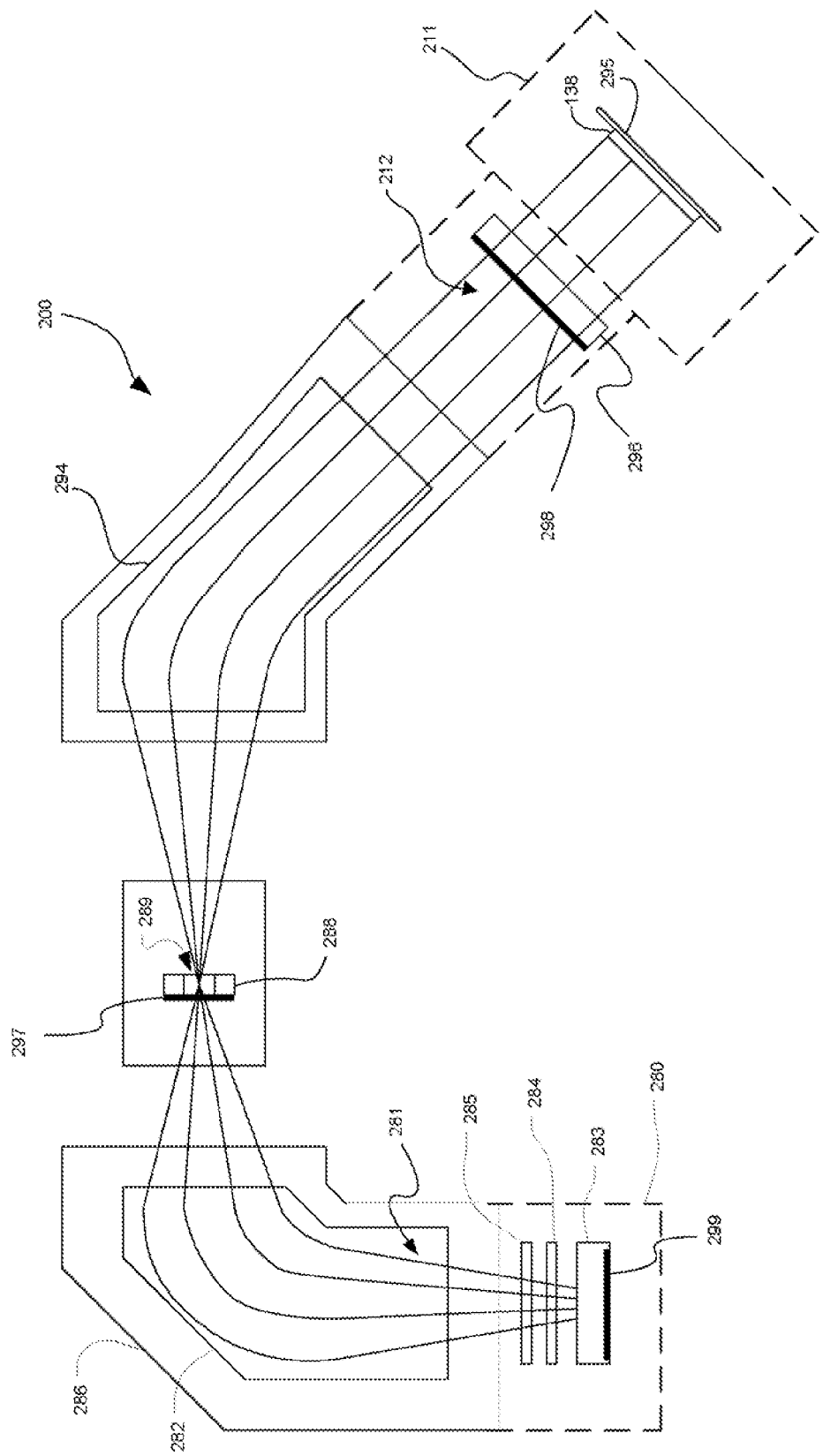
FIG. 4 is a block diagram of a beam-line ion implanter.

FIG. 4 is a block diagram of a beam-line ion implanter 200. In one instance, this may be for doping a semiconductor wafer. Those skilled in the art will recognize that the beam-line ion implanter 200 is only one of many examples of beam-line ion implanters that can produce ions. Thus, this fastening apparatus is not limited solely to the beam-line ion implanter 200 of FIG. 4.

In general, the beam-line ion implanter 200 includes an ion source 280 to generate ions that form an ion beam 281. The ion source 280 may include an ion chamber 283. A gas is supplied to the ion chamber 283 where the gas is ionized. This gas may be or may include or contain, in some embodiments, hydrogen, helium, other rare gases, oxygen, nitrogen, arsenic, boron, phosphorus, carborane, alkanes, or another large molecular compound. The ions thus generated are extracted from the ion chamber 283 to form the ion beam 281. The ion beam 281 passes through a suppression electrode 284 and ground electrode 285 to mass analyzer 286. Mass analyzer 286 includes resolving magnet 282 and masking electrode 288 having resolving aperture 289. Resolving magnet 282 deflects ions in the ion beam 281 such that ions of a desired ion species pass through the resolving aperture 289. Undesired ion species do not pass through the resolving aperture 289, but are blocked by the masking electrode 288.

Ions of the desired ion species pass through the resolving aperture 289 to the angle corrector magnet 294. Angle corrector magnet 294 deflects ions of the desired ion species and converts the ion beam from a diverging ion beam to ribbon ion beam 212, which has substantially parallel ion trajectories. The beam-line ion implanter 200 may further include acceleration or deceleration units in some embodiments. This particular embodiment has a deceleration unit 296.

An end station 211 supports one or more workpieces, such as workpiece 138, in the path of ribbon ion beam 212 such that ions of the desired species are implanted into workpiece 138. The workpiece 138 may be, for example, a silicon wafer or a solar panel. The end station 211 may include a platen 295 to support the workpiece 138. The end station 211 also may include a scanner (not shown) for moving the workpiece 138 perpendicular to the long dimension of the ribbon ion beam 212 cross-section, thereby distributing ions over the entire surface of workpiece 138. Although the ribbon ion beam 212 is illustrated, other embodiments may provide a spot beam. It will be understood to those skilled in the art that the entire path traversed by the ion beam is evacuated during ion implantation. The ion implanter 200 may include additional components known to those skilled in the art and may incorporate hot or cold implantation of ions in some embodiments.

The fastening apparatus 100 may be used, for example, to fasten a graphite aperture 297 about the resolving aperture 289 or on the masking electrode 288. A graphite lens 298 may be fastened to a lens in the deceleration unit 296. Shielding 299, which may be fabricated of graphite or other materials, may be fastened within the ion source 280 or ion chamber 283. The fastening apparatus 100 also may be used to fasten other components to other parts of the beam-line ion implanter 200.

One skilled in the art will recognize other systems and processes involved in semiconductor manufacturing, other systems and processes involved in plasma treatment, or other systems and processes that use accelerated ions that may use one embodiment of the fastening apparatus described herein. Some examples of this, for example, are a plasma doping tool, an ion shower, or a plasma immersion tool. Other semiconductor processing equipment known to those skilled in the art that can accelerate species and implant species into a substrate also may use an embodiment of the fastening apparatus described herein. Other semiconductor processing equipment, such as chemical vapor deposition (CVD), physical vapor deposition (PVD), or etch tools also may use a fastening apparatus consistent with an embodiment of the invention described herein. Embodiments of this fastening apparatus also may be used outside of semiconductor processing, such as in other electronic, medical, or mechanical devices. Thus, embodiments of this fastening apparatus is not limited solely to beam-line ion implanters.

Figure 5:
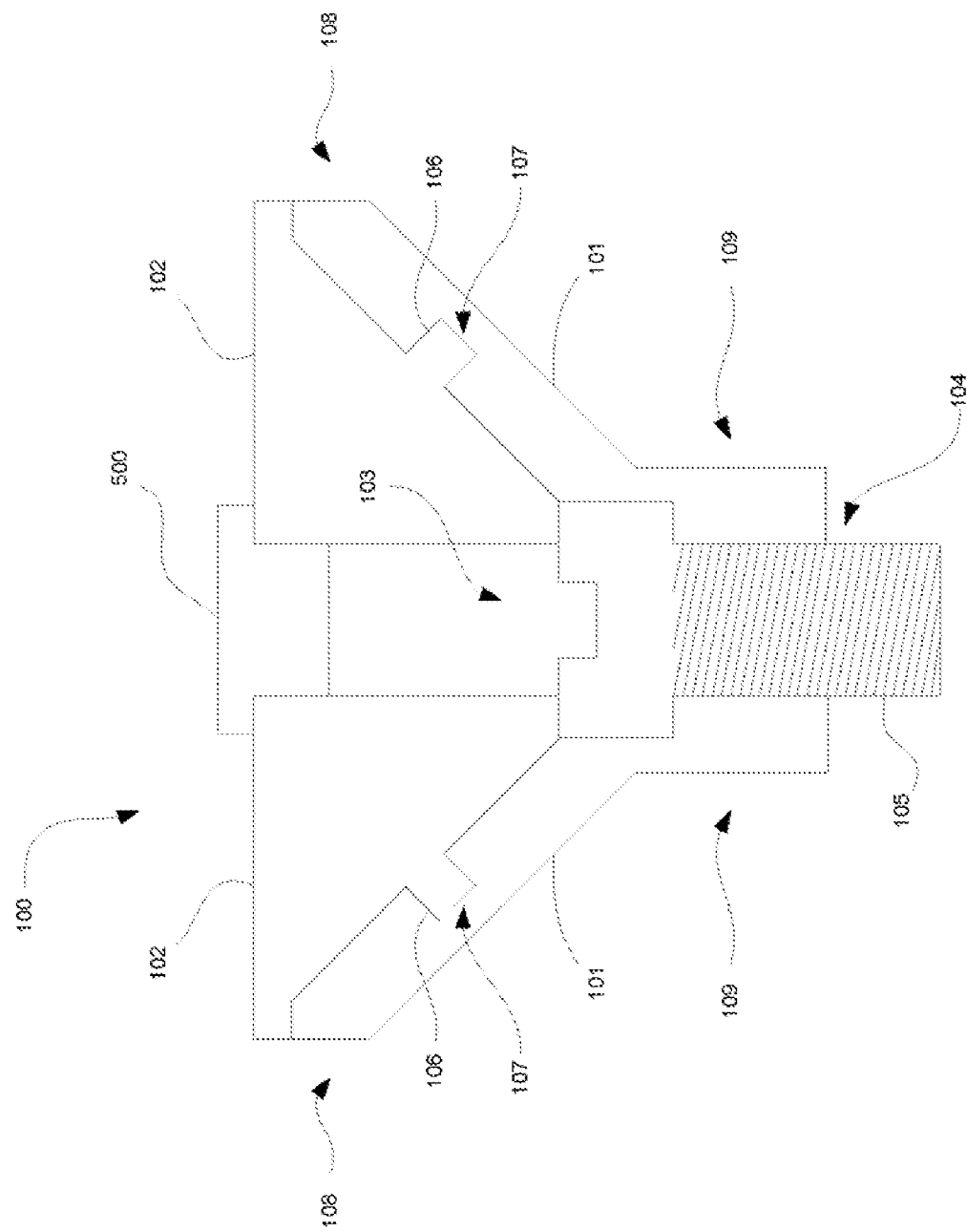
FIG. 5 is a cross-sectional view of the first embodiment of the fastening apparatus of FIG. 2 with a plug.

FIG. 5 is a cross-sectional view of the first embodiment of the fastening apparatus 100 of FIG. 2 with a plug 500. The plug 500 may be fabricated of or coated with graphite, a graphite-containing compound, another compound that does not contaminate an ion implanter, or the same material as the cap 102. The plug 500 is configured to block the passage 103. This further reduces contamination due to metal in an ion implanter because the threaded member 105 is no longer exposed through the passage 103. The plug 500 may be configured to be removed and the fastening apparatus 100 may be translated or removed from the passage 103 using a tool, such as a screwdriver, Allen wrench, hex key, or other tool known to those skilled in the art The terms and expressions which have been employed herein are used as terms of description and not of limitation, and there is no intention in the use of such terms and expressions of excluding any equivalents of the features shown and described (or portions thereof). It is also recognized that various modifications are possible within the scope of the claims. Other modifications, variations, and alternatives are also possible. Accordingly, the foregoing description is by way of example only and is not intended as limiting.

What is claimed is:

1. A fastening apparatus comprising:
    a cap defining a passage through the length of said cap, wherein said cap is fabricated of graphite;
    a body having a lower region and at least two upper panels, said lower region defining a passage through the length of said lower region, said upper panels configured to receive said cap, said upper panels configured to translate thereby retaining said cap between said upper panels; and
    a threaded member disposed in said passage of said lower region.

2. The fastening apparatus of claim 1, wherein said body is a spider.

3. The fastening apparatus of claim 1, wherein said body is fabricated of a material selected from the group consisting of stainless steel and aluminum.

4. The fastening apparatus of claim 1, further comprising a plug configured to be disposed in said passage of said cap opposite of said threaded member, said plug fabricated of graphite.

5. The fastening apparatus of claim 1, wherein said upper panels are angled from said lower region of said body.

6. The fastening apparatus of claim 1, wherein said cap has at least one protrusion and said upper panels define a recess configured to receive said protrusion of said cap.

7. A fastening apparatus comprising:
    a cap having at least one protrusion, said cap defining a passage through the length of said cap, wherein said cap is fabricated of graphite;
    a body having a lower region and at least two upper panels, said lower region defining a passage through the length of said lower region, said upper panels configured to receive said cap and said upper panels defining a recess configured to receive said protrusion of said cap, said upper panels configured to translate thereby retaining said cap between said upper panels; and
    a threaded member disposed in said passage of said lower region.

8. The fastening apparatus of claim 7, wherein said body is fabricated of a material selected from the group consisting of stainless steel and aluminum.

9. The fastening apparatus of claim 7, further comprising a plug configured to be disposed in said passage of said cap opposite of said threaded member, said plug fabricated of graphite.

10. The fastening apparatus of claim 7, wherein said upper panels are angled from said lower region of said body.

* * * * *